United States Patent [19]

Hajj-Chehade

[11] Patent Number: 4,605,904

[45] Date of Patent: Aug. 12, 1986

[54] PHASE LOCKED LOOP FREQUENCY DEMODULATOR HAVING AN ADJUSTABLE BANDWIDTH

[75] Inventor: Mohammed Hajj-Chehade, Asnieres, France

[73] Assignee: U.S. Philips Corporation, New York, N.Y.

[21] Appl. No.: 731,815

[22] Filed: May 8, 1985

[30] Foreign Application Priority Data

May 15, 1984 [FR] France .................................. 84 07500

[51] Int. Cl.⁴ .............................................. H03D 3/00
[52] U.S. Cl. ....................................... 329/50; 329/122; 329/132; 455/214; 455/312; 358/23
[58] Field of Search ................. 329/50, 122, 132, 136, 329/124; 455/214, 309, 312; 358/23

[56] References Cited

U.S. PATENT DOCUMENTS 3,209,271  9/1965  Smith ................................... 329/122
4,473,801  9/1984  Maurer et al. ......................... 329/50
4,531,148  7/1985  Ohta et al. ........................... 358/23 R

*Primary Examiner*—Siegfried H. Grimm
*Attorney, Agent, or Firm*—Thomas A. Briody; William J. Streeter; Marianne R. Rich

[57] ABSTRACT

Video frequency demodulator having a phase-locked loop (P.L.L.) intended more specifically for receiving signals transmitted via satellites, in which the bandwidth of the loop is adjusted as a function of the signal/noise ratio for adapting the demodulation threshold. Measuring the signal/noise ratio is realized by sampling (10, 12, 25) briefly the demodulated output signal (13) at the beginning of a picture field scan, rectifying this signal (10) and comparing (7) the stored rectified signal (14) to a predetermined voltage value (21). The signal coming from the comparator (16) is applied to the gain-control input of a variable-gain amplifier (6) incorporated in the control loop.

6 Claims, 2 Drawing Figures

PHASE LOCKED LOOP FREQUENCY DEMODULATOR HAVING AN ADJUSTABLE BANDWIDTH

The invention relates to a frequency demodulator whose bandwidth can be adjusted during operation, used in a picture receiver receiving inter alia synchronizing signals, this demodulator being of the phase control loop type formed in essence by a phase comparator, a filter and a voltage controlled oscillator.

A particularly interesting field of application of such a demodulator is the field of satellite television. The transmitters used have a limited power and consequently the receivers must have the highest possible noise immunity. The curve representing the signal/noise ratio of the demodulated signal relative to the signal/noise ratio of the input signal has a portion, for an input signal with little noise, in which the two ratios develop substantially proportionally. In contrast therewith, below a certain threshold, the demodulation threshold, the signal/noise ratio of the demodulated signal degrades very rapidly when the signal/noise ratio of the input signal decreases. For this application the phase control loop type of demodulator is the type which has the best demodulation threshold performances.

However, when reception is particularly bad, a demodulator of this type produces an image which is degraded by numerous white or black dots. A reduction of the passband of the demodulator in proportion as the signal/noise ratio degrades makes it possible to obtain a picture whose maximum contrast decreases, but whose noise is reduced such that the overall result is more agreeable.

A demodulator in which the demodulation threshold is varied as a function of the input signal and the distortion at the output, is described in Japanese patent specification no. 57-171808 filed on 15.04.81.

Said demodulator utilizes the rectified input signal which is added to a distortion component which is taken from the output and also rectified to fix the threshold value at the input of an operational amplifier which produces the demodulated voltage. It has the disadvantage as regards the technical problem mentioned above, that the variation in the demodulation threshold is not directly connected with the signal/noise ratio, since there is not always a systematic correspondence between the level of the input signal or the distortion and the signal/noise ratio.

The invention has for its object to still further improve the receiving conditions by providing a novel means for controlling the bandwidth of the demodulator.

To that effect, the demodulator according to the invention, is characterized in that it comprises a sampling circuit for taking a sample of the demodulated signal from the output of the demodulator at the start of a synchronizing signal, the sampling circuit comprising a rectifier for rectifying said sampling signal, a comparator for comparing the rectified sampling frequency with a predetermined a.c. voltage, and in that the output of this comparator which produces a correction signal is connected to a variable-gain input of a variable-gain amplifier included in the control loop.

The arrangement according to the invention has the advantage that it provides a particularly accurate and reliable measurement of the noise at the output, since it measures this noise during an instant (at the beginning of a line or field synchronizing signal) at which the signal is exclusively composed of noise, instead of trying to measure the signal/noise ratio in the presence of a useful signal.

Advantageously, the demodulator according to the invention comprises a field frequency divider, so as to take a sample during a single field synchronizing signal out of a plurality of such signals. Thus, degradation of the picture which might be produced when a correction is effected at each start of the field is avoided, which degradation might be caused by transient phenomena which may appear during the correction.

In a specific embodiment the demodulator according to the invention comprises a memory for storing the value of the rectified sampled signal or the value of the correction signal.

Advantageously, the variable gain amplifier is formed by two parallel paths, one for the lower frequencies and the other for the higher frequencies, the path intended for the higher frequencies being a variable-gain path, while the path intended for the lower frequencies has a fixed gain. Thus one control is permanently maintained for the lower frequencies or the slow derivatives and there is no risk for unlocking the loop.

The following description, which is given by way of non-limitative example with reference to the accompanying drawings will make it better understood how the invention can be put into effect.

Figure 1:
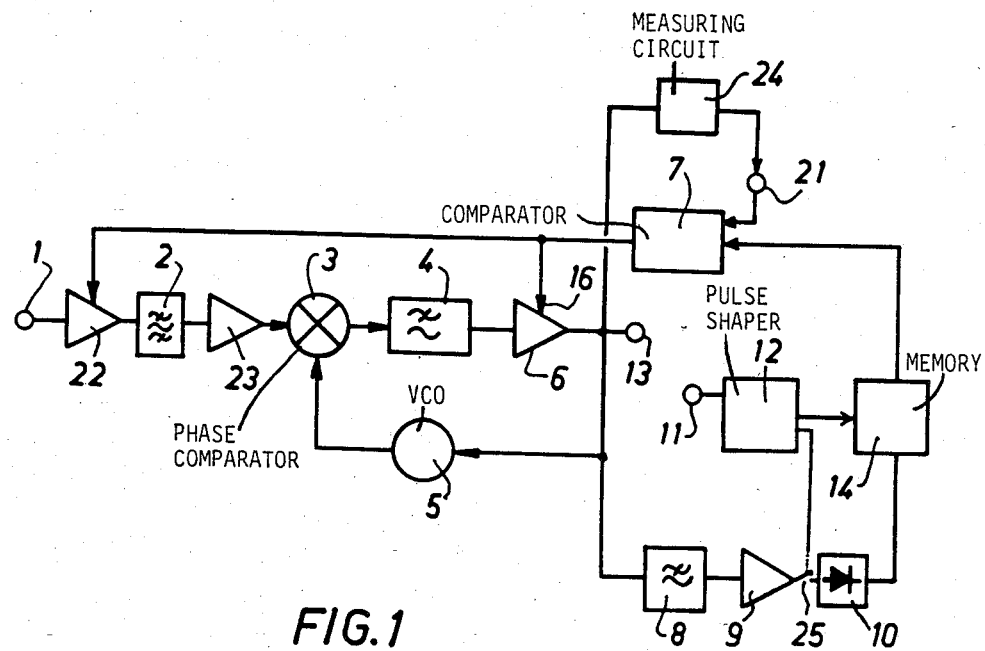
FIG. 1 shows the block circuit diagram of a demodulator according to the invention.

The demodulator of FIG. 1 comprises a phase control loop which is in essence formed by a phase comparator 3, a low pass filter 4 and a voltage-controlled oscillator 5.

The signal to be demodulated is applied to the input terminal 1. It passes through a variable-gain intermediate frequency amplifier 22, an intermediate frequency filter 2, optionally a linear amplifier 23 and is finally applied to an input of the phase comparator 3, whose other input (at bottom in the Figure) is coupled to the output of the voltage-controlled oscillator 5. The product of the phase comparator 3 being applied to the input of the low-pass loop filter 4, passes through an amplifier 6 still to be described in greater detail hereinafter, and is finally applied to the demodulated signal output terminal 13. This output signal is furthermore applied to the frequency control input of the voltage controlled oscillator 5.

The intermediate frequency filter 2 is an integral part of the demodulator, as the narrow band of the control loop is not sufficient to combat noise. This filter 2 must have a sufficiently wide band to prevent excessive distortion, and a sufficiently narrow band to improve the demodulation threshold. A bandwidth of e.g. 30 MHz is appropriate. For an intermediate frequency of, for example, 441 MHz a surface wave filter is a good choice.

The phase detector 3 is a balanced ring mixer realized with Schottky diodes so as to obtain an appropriate speed.

The voltage-controlled oscillator 5 is of a type having a high sensitivity, approximately 22 MHz/V, which allows a large loop bandwidth without significant distortion.

The demodulator according to the invention comprises a sampling circuit 10, 12, 25 for taking a sample of the output signal (13) of the demodulator at the start of a field synchronizing signal applied to terminal 11, which output sample is passed through a filter 8 and an amplifier 9 and is rectified in a rectifier circuit 10 of the sampling circuit 10, 12, 25. The filter 8 and the amplifier 9 can advantageously be formed by the filter and the video amplifier generally used in the video section of a TV-receiver.

The output signal of the sampler is applied via a circuit 14, which will be described in greater detail in the sequel, to an input of a comparator 7, where it is compared with a predetermined d.c. voltage applied to a further input 21. The value of this d.c. voltage is chosen such that in practice it will be equal to the rectified noise voltage normally produced by the sampler when the signal-to-noise ratio of the demodulator signal is 30 dB. Thus, the comparator does not supply a correction signal when the signal-to-noise ratio is better than 30 dB. The output of this comparator 7, which thus provides a correction signal for the passband of the demodulator, is connected to the gain control input of the variable gain amplifier 6 incorporated in the loop.

The sampling circuit 10, 12, 25 operates as follows: upon receipt of a field pulse on terminal 11, a circuit 12 of the sampling circuit 10, 12, 25 adjusts this pulse to the appropriate shape for controlling, during the time interval in which there is no video signal and consequently there is only noise at the output of the demodulator, the enabling of the rectifier circuit 10, for example by closing a gate 25 of the sampling circuit 10, 12, 25 arranged at the input of circuit 10, so as to apply an input signal to this rectifier circuit 10 only during said time interval. The rectified voltage smoothed in a capacitor can be applied directly to the comparator 7. Preference should be given to storing this value to ensure that it is retained between two sampling operations. To that end, the memory 14 is arranged between the output of the rectifier circuit 10 and the input of the comparator 7. The instant at which the value is entered into the memory 14 is also controlled by the pulse shaping circuit 12. The memory 14 may be constituted by a single capacitor associated with impedance matching circuits and/or gate circuits, which are easy to realize by a person skilled in the art. The memory 14 may alternatively be constituted by a digital memory, in which case it is preceded by an analog-to-digital converter. In that case the comparator 7 is in the digital form, and is followed by a digital-to-analog converter.

Preferably, the pulse shaping circuit 12 also comprises a field frequency divider. The field sychronizing signals applied to the input 11 are counted and only one signal out of, for example, one thousand signals is used to trigger a sampling operation. As the field frequency is, for example, 50 Hz, sampling is effected every 20 seconds. This has for its object to prevent consecutive transient phenomena occurring during adjustment of the demodulator from becoming visible, which might be the case when they were produced in each picture.

Figure 2:
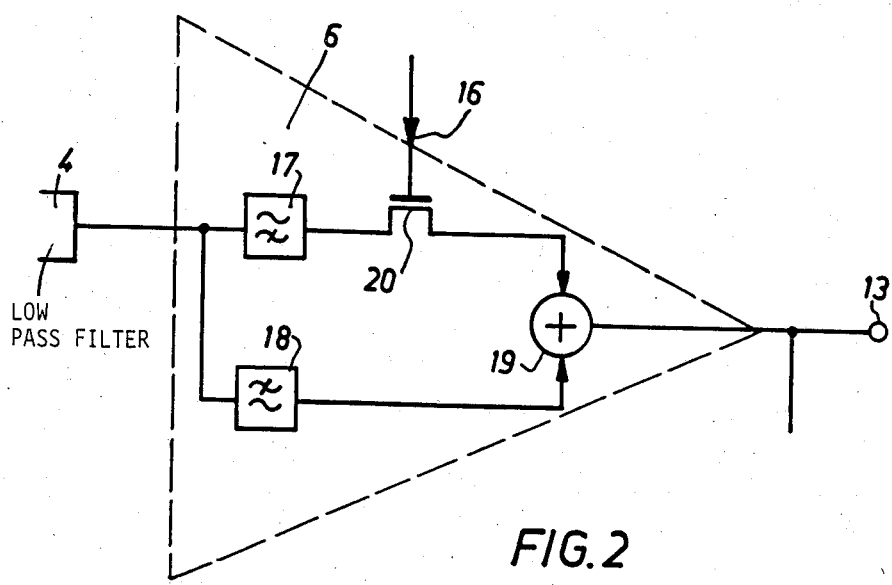
FIG. 2 shows an embodiment of the variable-gain amplifier.

FIG. 2 shows a variable-gain amplifier 6 connected between the output of a loop filter 4 and the output terminal of the demodulated signal 13. This amplifier is formed by two parallel paths, one path comprising a low-pass filter 18 for the lower frequencies and the other path comprising a high-pass filter 17 for the highest frequencies, and the path intended for the higher frequencies has a variable gain because of the use of a FET transistor 20 operating as a variable resistor, whilst the path intended for the lower frequencies has a fixed gain. The signals coming from these two paths are added together in an adder circuit 19 and the sum signal is supplied to the output 13. The loop filter 4 and the high-pass filter 17 may optionally be combined to form one single bandpass filter which may be used instead of the high-pass filter 17. Splitting into two paths enables a separate control of the static and dynamic behaviours of the loop, and makes it possible to obtain a good stability and a wide video band. A loop bandwidth over 22 MHz is necessary in normal conditions (for signal/noise ratios of the input signal better than or equal to 14 dB).

The controlable path of the amplifier 6 is in practice formed by a fixed-gain amplifying portion (not shown) associated with a variable attenuator 20.

Referring again to FIG. 1, the correction signal originating from the comparator 7 is also conveyed to the variable-gain, intermediate-frequency amplifier 22 to control its gain. On degradation of the signal/noise ratio the passband of the assembly is reduced by the control of the amplifier 22, whilst controlling the amplifier increases the attenuation factor of the loop 3, 4, 5, 6.

The noise below the demodulator threshold appears in the form of pulses because of temporary phase unlocks (phase slips), alternatively referred to as "clicks" of varying amplitudes and widths. By reducing the bandwidth of the loop, the demodulator avoids many clicks. The minimum bandwidth of the loop is set to approximately 10 MHz. With this value acceptable pictures are obtained from an input signal having a sub-carrier/noise ratio of only 2 dB.

The predetermined d.c. voltage applied to the terminal 21 is obtained with advantage in a measuring circuit 24 and by adding together a d.c. voltage which is proportional to the amplitude of the useful video signal (that is to say of the picture signal outside the synchronization peaks) and a constant d.c. voltage of a predetermined fixed value.

The major portion of the d.c. voltage generated by the circuit 24 and supplied to the terminal 21 is fixed however, as by adding together the two voltages the circuit 24 introduces a weighting operation such that the constant voltage is predominating and the voltage proportional to the video signal represents not more than approximately 10% of the overall voltage. This arrangement has for its object to correct the demodulation threshold as a function of the content of the signal (white/black) to take account of the fact that the clicks are more noticeable in the black than in the white colors.

It should be noted that a limiter is not necessary in the demodulator, and that the presence of a limiting device, such as a proper limiter or Gilbert multiplier, would increase the demodulation threshold.

A subcarrier level of 0 dBm at the input of the phase comparator gives a loop bandwidth of approximately 23 MHz, and for $-15$ dBm this loop bandwidth decreases to 12 MHz. When the carrier/noise ratio is very low, for example 2 dB, the width is automatically reduced to 10 MHz. Thus, the subjective quality of the image degrades but non-dramatically compared to an ordinary demodulator which is not suitable for use at such levels of the signal/noise ratio.

It will be obvious that variations of the circuit described here by way of example can be designed without departing from the scope of the invention. The gate 25, for example, may be positioned elsewhere in the path from the terminal 13 to the memory 14, or the line synchronizing signal may be used instead of the field synchronizing signal.

The memory 14 might alternatively be positioned downstream of the comparator 7 for storing the correction voltage, which would then be temporarily established at the beginning of the field synchronizing signal, instead of storing the rectified sample utilized to establish the comparison.

What is claimed is:

1. A frequency demodulator whose bandwidth can be adjusted during operation, used in a TV picture receiver receiving inter alia synchronizing signals, this demodulator being of the phase control loop type formed in essence by a phase comparator, a filter and a voltage-controlled oscillator, characterized in that it comprises a sampling circuit for taking a sample of the demodulated signal from the output of the demodulator at the start of a synchronizing signal, the sampling circuit comprising a rectifier for rectifying said sample signal, a comparator for comparing the rectified sample signal with a predetermined d.c. voltage, and in that the output of this comparator which produces a correction signal is coupled to a variable gain input of a variable-gain amplifier included in the control loop.

2. A demodulator as claimed in claim 1, characterized in that it comprises a field frequency divider, so as to take a sample during one single field synchronizing signal out of a plurality of such signals.

3. A demodulator as claimed in claim 1, characterized in that it comprises a memory for storing the value of one of the rectified sampling signal and the correction signal.

4. A demodulator as claimed in claim 1, characterized in that said variable-gain amplifier is formed by two parallel paths, one for the lower frequencies and the other for the higher frequencies, the path intended for the higher frequencies has a variable gain, while the path intended for the lower frequencies has a fixed gain.

5. A demodulator as claimed in claim 1, comprising inter alia, upstream of the phase comparator in the path through which the signal to be demodulated flows, a variable-gain intermediate-frequency amplifier, characterized in that the correction signal originating from the comparator is also conveyed to said intermediate-frequency amplifier for controlling its gain.

6. A demodulator as claimed in claim 1, characterized in that said predetermined d.c. voltage used in the comparator is obtained in a measuring circuit (24) by adding together a d.c. voltage which is proportional to the amplitude of the useful video signal and a constant d.c. voltage of a predetermined fixed value.

* * * * *